(12) United States Patent
Dasaratha et al.

(10) Patent No.: US 7,364,666 B2
(45) Date of Patent: Apr. 29, 2008

(54) FLEXIBLE CIRCUITS AND METHOD OF MAKING SAME

(75) Inventors: Sridhar V. Dasaratha, Woodbury, MN (US); James S. McHattie, Austin, TX (US); James R. Shirck, Austin, TX (US); Hideo Yamazaki, Tokyo (JP); Yuji Hiroshige, Sagamihara (JP); Makoto Sekiguchi, Sagamihara (JP)

(73) Assignee: 3M Innovative Properties Company, St. Paul, MN (US)

( * ) Notice: Subject to any disclaimer, the term of this patent is extended or adjusted under 35 U.S.C. 154(b) by 6 days.

(21) Appl. No.: 11/294,828

(22) Filed: Dec. 6, 2005

(65) Prior Publication Data

US 2006/0134914 A1    Jun. 22, 2006

Related U.S. Application Data

(60) Provisional application No. 60/637,797, filed on Dec. 21, 2004.

(51) Int. Cl.
*B44C 1/22* (2006.01)

(52) U.S. Cl. ............................ 216/83; 216/90; 216/91; 216/95; 438/750; 438/754; 438/756

(58) Field of Classification Search ................. 216/83, 216/90, 91, 95; 438/750, 754, 756
See application file for complete search history.

(56) References Cited

U.S. PATENT DOCUMENTS

| 4,425,380 | A | * | 1/1984 | Nuzzi et al. ............... 427/97.2 |
| 4,978,422 | A |   | 12/1990 | Letize et al. |
| 5,044,073 | A |   | 9/1991 | Ogasawara et al. |
| 5,397,599 | A |   | 3/1995 | Chao et al. |
| 5,478,462 | A | * | 12/1995 | Walsh ........................ 205/169 |
| 5,998,739 | A |   | 12/1999 | Shirai et al. |
| 2002/0084248 | A1 | * | 7/2002 | Kong et al. ................... 216/35 |
| 2004/0110024 | A1 | * | 6/2004 | Katsuki et al. ............. 428/626 |

FOREIGN PATENT DOCUMENTS

WO    WO 2005/055682    6/2005

OTHER PUBLICATIONS

Cai Changlong et al., "Study on Nickel-Chrome-Iron Alloy Film by Means of the Pulse Multi-arc Ion Source", IEEE 19th Int Symp On Discharges and Electrical Insulation in Vacuum, pp. 548-550; 2000.*

* cited by examiner

*Primary Examiner*—Binh X. Tran
(74) *Attorney, Agent, or Firm*—Melanie G. Gover

(57) ABSTRACT

Disclosed is a method for making flexible circuits in which portions of a tie layer are removed by etching the underlying polymer. Also disclosed are flexible circuits made by this method.

21 Claims, 2 Drawing Sheets

FLEXIBLE CIRCUITS AND METHOD OF MAKING SAME

CROSS REFERENCE TO RELATED APPLICATIONS

This application claims the benefit of U.S. Provisional Application Ser. No. 60/637,797, filed Dec. 21, 2004.

FIELD

This disclosure relates to flexible circuits having tie layers and methods of making them.

BACKGROUND

Flexible circuits are typically composed of at least one metal layer such as copper (Cu), nickel (Ni), tin (Sn), silver (Ag) or gold (Au) on a flexible polymeric film such as polyester (PET), polyimide (PI), or liquid crystal polymer (LCP). When the metal is attached to the polymer film without the use of an additional adhesive layer, the construction is often classified as a "two-layer" or "adhesiveless" flexible circuit. Generally, two-layer substrates consist of polymer films of about 12 to 75 microns thickness. A thin tie layer is usually employed to promote adhesion between the metal and the polymer film, to prevent or minimize corrosion at the metal/film interface, and to provide a diffusion barrier between the metal and the polymer film. For high performance applications, the primary metal layer is commonly copper while the film layer is polyimide.

Tie layers range from about 2 nm to about 500 nm thick and are formed by methods such as vacuum sputtering, vacuum evaporation, and chemical plating typically of chromium (Cr), nickel (Ni), cobalt (Co), molybdenum (Mo) or their related alloys. To be useful in high performance flexible circuit applications using copper as the metal, it should be possible to etch the tie layer in the presence of copper, so that the copper traces can be electrically isolated. Often this is a challenging requirement. Tie layers that are highly corrosion resistant are difficult to etch. Aggressive etchants that can attack the corrosion resistant tie layer can also significantly attack the copper. In addition, many non-corroding tie layers tend to passivate readily and are less active than copper. As a result, copper can inhibit the etching of the tie layer and make it difficult to remove, especially in fine pitch regions of a circuit.

SUMMARY

One aspect of the present invention provides a method comprising: providing a dielectric substrate having a first metal layer that is permeable to a dielectric etchant capable of etching the dielectric substrate; and exposing at least a portion of the first metal layer to the dielectric etchant such that the portion of the dielectric layer under the exposed portion of the first metal layer is etched, wherein the dielectric etchant comprises an oxidizing agent and a base that comprises at least one of (1) about 20 to about 100 grams/liter of sodium hydroxide and (2) about 60 to about 100 grams/liter of potassium hydroxide.

Another aspect of the invention provides a method comprising: providing a dielectric substrate having a first metal layer that is permeable to a dielectric etchant capable of etching the dielectric substrate; and exposing at least a portion of the first metal layer to the dielectric etchant such that the portion of the dielectric layer under the exposed portion of the first metal layer is etched, wherein the dielectric etchant comprises sodium permanganate and at least one base.

Another aspect of the invention provides a method comprising: providing a dielectric substrate having a first metal layer; exposing the first metal layers to a metal etchant capable of etching the first metal layer for a time sufficient to cause the first metal layer to be thinned enough to be permeable to a dielectric etchant capable of etching the dielectric substrate; and exposing at least a portion of the first metal layer to the dielectric etchant such that the dielectric substrate under the exposed portion of the first metal layer is etched.

Another aspect of the invention provides an article comprising: a dielectric substrate having a treated surface, a patterned first metal layer leaving a portion of the treated surface of the dielectric substrate exposed, and a second metal layer covering the patterned first metal layer, wherein the exposed portion of the treated surface of the dielectric substrate has been removed.

Other features and advantages of the invention will be apparent from the following drawings, detailed description, and embodiments.

DETAILED DESCRIPTION

Figure 1:
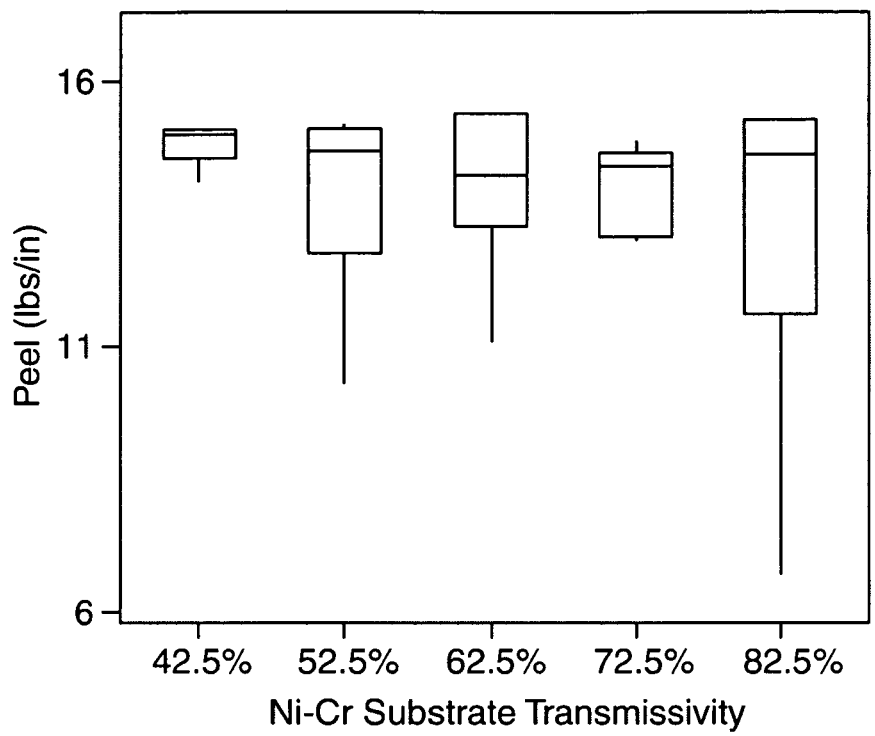
FIG. 1 shows the peel strength for exemplary articles of the present invention.

Flexible circuits are typically manufactured using an additive or a subtractive process including various procedures such as metal sputtering, resist laminating, resist exposing, resist developing, etching, and plating. The sequence of such procedures may be varied as desired for the particular circuit being made.

In a typical subtractive process using a tie layer, a dielectric substrate is first provided. The dielectric substrate may be a polymer film made of, for example, polyester, polyimide, liquid crystal polymer, polyvinyl chloride, acrylate, polycarbonate, or polyolefin and typically has a thickness of about 10 μm to about 600 μm. The dielectric substrate is sputtered with a first metal layer of, e.g., nickel, chrome, nickel-chrome, cobalt, molybdenum, to form a tie layer. This is typically followed by deposition of the primary conductive seed layer (e.g., copper, gold, or alloys thereof), which can then be plated up further with a conductive metal to a desired thickness by known electroplating or electroless plating processes.

Next, a photoresist is applied onto the conductive layer of this metal/dielectric substrate. The photoresist may be a dry film resist that is applied by lamination process or a liquid photoresist that is applied by a coating process. The photoresist is then exposed to ultraviolet light or the like, through a mask or phototool, crosslinking the exposed portions of the resist. The unexposed portions of the photoresist are then developed with an appropriate solvent until the desired patterns are obtained. The exposed conductive metal is then etched away using a suitable etchant. Suitable etchants include ammoniacal solutions and cupric chloride with hydrochloric acid.

Some tie layers may be completely removed during this etching step. This will depend on both the thickness and composition of the tie layer. In addition the galvanic potential of the tie layer with respect to the conductive layer material in a given etchant will also have a significant effect on the removal of the tie layer. However, suitable etching time is largely determined by the amount of conductive layer material that needs to be removed. Additional exposure of the conductive layer to the etchant for the time necessary to completely remove the tie layer allows the etchant to continue to etch the metal traces that have been formed. Thus, a separate step may be needed to etch the tie layer using an etchant that does not etch the conductive layer material. Finally, the remaining resist is stripped off the circuit using a suitable solvent.

In a typical additive process, a dielectric substrate may first be coated with a tie layer of, e.g., chrome, nickel or alloys thereof using a vacuum sputtering technique. A thin first conductive seed layer, typically copper, is then deposited using a vacuum sputtering technique. The materials and thicknesses for the dielectric substrate and conductive metal layer may be the same as for the substractive process, described above. After the tie layer and seed layer are sputtered onto the polyimide, a flash metal layer of 1 to 5 microns is plated. The flash layer is normally the same material as the seed layer.

The conductive metal layer can be patterned by a number of well known methods including photolithography, print and etch, laser ablation, and laser scribing. In the case of photoresists, which may be aqueous or solvent based, and may be negative or positive photoresists, they may be laminated on the conductive metal layer using standard laminating techniques such as applying dry resist with hot rollers. The photoresist is then exposed to ultraviolet light or the like, through a mask or phototool, crosslinking the exposed portions of the resist. The unexposed portions of the photoresist are then developed with an appropriate solvent until the desired trace patterns are obtained. The exposed portions of the conductive metal layer may then be further plated using standard electroplating or electroless plating methods until the desired circuit thickness is achieved.

The remaining resist is then stripped off the conductive layer. The exposed areas of the unplated conductive layer are then etched with a suitable etchant such as a hydrogen peroxide and sulfuric acid etchant. Some tie layers may be completely removed during this etching step, but many are slow to etch compared to the plated metal, and are difficult to remove. This depends on both composition and thickness and the galvanic potential of the tie layer as compared to that of the conductive metal layer. However, suitable etching time is largely determined by the amount of conductive material that needs to be removed. As previously mentioned, additional exposure of the conductive layer to the etchant for the time necessary to completely remove the tie layer will allow the etchant to continue to etch the metal traces. Thus, a separate step may be needed to etch the tie layer using an etchant that does not etch the conductive material. Finally, the resist is stripped off the circuit using a suitable solution.

As stated, for both the additive and subtractive process, a separate step is needed to guarantee removal of the tie layer. In general, it is difficult to find an etchant that can selectively etch the tie layer without etching the conductive layer, which is typically copper. Also, such an etchant is likely to be highly specific to one tie layer material and may be poorly suited for another, which makes finding a general-use tie layer etchant difficult.

At least one aspect of the present invention allows for the manufacture of flexible circuits with a wide range of corrosion-resistant tie layer materials, including highly corrosion-resistant tie layers such as nickel, chrome, and nickel-chrome alloys. The tie layer is applied in a manner to allow a polymer etchant access to the polymer substrate underlying the tie layer. As the polymer etchant erodes the underlying polymer, the tie layer is stripped away as the support beneath it is removed. Accordingly, any corrosion resistant tie layer may be used to make a flexible circuit, without concern about the etchability of the tie layer, thus providing a solution for the conflicting tie layer requirements of corrosion resistance and etchability.

This method of tie layer removal has the added advantage that the impact on the copper traces is minimal. Additionally, it enables an additive process to be implemented without the need for chloride based chemistries to remove the tie layer, thus avoiding reliability issues related to residual chloride ions between copper traces.

Specifically, at least one embodiment of the present invention includes sputtering a polymeric substrate with a corrosion-resistant tie layer to a desired thickness, then subsequently removing the exposed portions of the tie layer by etching the polymer substrate below the tie layer. Suitable selection of tie layer thickness enables the tie layer to be removed where needed while meeting adhesion and corrosion-resistance performance requirements. In at least one embodiment, the tie layer has an optical transmission greater than about 20%. In at least one embodiment, the tie layer has an optical transmission less than about 80%.

According to at least one embodiment of the present invention, the thickness of the tie layer is controlled so that it can perform the functions of adhesion and corrosion-resistance while also allowing an etchant access to the polymer surface. In other words, corrosion-resistant tie layers can be deposited such that they are thin enough to be permeable to an etchant to allow it access to the polymer substrate, yet sufficiently thick to function as an effective barrier between the conductive metal layer and the polymer, in the areas where the tie layer is not removed. If the tie layer is too thin, it will be easy to etch the polymer, but adhesion and corrosion-resistance performance will be negatively affected. If the tie layer is too thick, it will be difficult to remove the tie layer, because the etchant will not be able to access the polymer surface, even though adhesion and corrosion-resistance performance may be satisfactory. It has been found that there is typically a range of tie layer thicknesses at which all of these functions can be satisfactorily achieved. The suitable range of tie layer thickness for a given system of tie layer, dielectric layer, metal trace layer, and etchant will vary and can be determined through trial and error.

The tie layer will typically be covered by a patterned metal trace layers. The trace layer is typically of a composition and sufficient thickness to be impermeable to the dielectric etchant. Typically the metal of the trace layer is copper. If the tie layer needs to be thinned before etching of the underlying polymeric substrate is etched, the tie layer may be etched after the trace layers have been formed, preferably using an etchant that does not also etch the trace layer. Alternatively, the trace patterns may be formed by using an etchant on the trace layer conductive material that will also etch the tie layer and etching may be allowed to continue after the trace layer conductive material has been etched.

Many different polymer etchants now known or later developed in the art may potentially be used in the present invention. As long as an etchant is suited to the polymer material, the tie layer material is not significant if it has been deposited to an appropriate thickness. The same polymer etchant can be used for any tie layer material.

Oxidizing agents (e.g., potassium permanganate, sodium permanganate, potassium ferricyanide, etc.) in an alkaline solution (e.g., sodium or potassium hydroxide) are particularly suitable for etching surface layers of polyimide. Suitable ranges of concentrations for the oxidizing agents, in particular potassium permanganate and sodium permanganate, are from about 20 grams/liter (g/l) to about 200 g/l, including 20, 40, 60, 80, and 100 g/l. Sodium permanganate is more soluble than potassium permanganate, which allows for its use in higher concentrations, which in turn, can provide higher etching rates. Suitable ranges of concentrations for sodium hydroxide or potassium hydroxide are up to about 100 g/l, including 20, 40, 60, and 80 g/l. These etchants are also suitable for etching other substrates such as polyester. Potassium hydroxide is more effective at higher concentrations, so its preferred range of concentrations is from about 60 to about 100 g/l. All concentrations of components of an etching solution discussed herein refer to concentrations in a prepared mixed solution unless otherwise noted.

Whether using an additive process or a subtractive process, in conventional processes, tie layer metal is typically removed in a manner that has minimal etching effect on the polymeric substrate. It has been believed that excess etching of the polymeric substrate can degrade the film and have an adverse impact on circuit reliability.

An additional benefit of at least one aspect of the present invention is that, as compared with conventional processes, the surface of the polymer substrate of circuits made according to the present invention have higher surface resistance between the conductive traces than in circuits made by other methods. It has been discovered that removal of the tie layer metal by etching the polymer substrate increases the surface insulation resistance between the conductive traces. Additionally, it has been discovered that if etching of the polymer substrate surface is continued after tie layer removal, it further improves the polymer surface resistance.

In one particular instance, it was found that a polyimide substrate that had been subjected to oxygen plasma treatment prior to tie layer sputtering had a damaged surface. The plasma-treated surface had a relatively low insulation surface resistance compared to untreated polyimide. Removing this damaged surface by etching this polyimide resulted in improved surface insulation resistance. Once the damaged layer was removed, additional etching did not have a significant effect on the surface resistance. By removing the damaged polyimide, much higher surface resistance (one or more orders of magnitude) could be attained than with conventional circuit-making processes. Higher surface resistance is important in passing more stringent reliability tests, e.g., high temperature high humidity biased tests (HHBT).

Accordingly, after removal of the tie layer, etching may be continued to remove a surface-treated portion of a polymer substrate, which may provide a higher surface resistance than with conventional circuit-making processes. Polymer surface treatment may include, for example, plasma, optical, flame, wet chemical, and mechanical processes.

It should be noted that in the case of a polyimide substrate, the etchant should be selected so that the surface layers are removed without a build up of polyamic acid within the polyimide film. Build up of polyamic acid reduces surface resistance instead of increasing it.

EXAMPLES

This invention may be illustrated by way of the following examples.

Example 1

In this example, polyimide film, available under the trade designation KAPTON 1.5E from DuPont, was used for three substrates. The substrate films were heated under vacuum at 200-350° C. for 5-60 seconds to remove water. The surfaces of the films were then cleaned by direct current oxygen glow at 10-100 mTorr, 1-5 kV, 2-500 mA. Then 80:20 Ni:Cr alloy tie layer was sputter deposited on the three substrates at 3 to 5 mTorr. The levels of total optical transmission (Tr) for the three Ni—Cr coated substrates were 50%, 72.5% and 77.5%, respectively. The tie layer coating was applied in a roll-to-roll vacuum web coating system. The deposition source was DC magnetron sputtering. The process gas was a mixture of oxygen and argon, with oxygen/argon ratio approximately less than 5%.

All three substrates were then dipped in a solution comprised of 20 g/l NaOH and 20 g/l potassium permanganate at 50° C. For the 50% Tr Ni—Cr substrate, no tie layer was removed, even after 5-10 minutes of etching. The 72.5% Tr Ni—Cr substrate also did not show any significant etching after 4 minutes. However, when the 77.5% Tr Ni—Cr substrate was dipped in the etchant, the tie layer was removed in 2 minutes and surface resistance was greater than 1 e+12 ohms/sq.

Example 2

Two polyimide substrates were sputtered with NiCr tie layer, in a manner similar to that described in Example 1, to a thickness having a total optical transmission of 72.5%. In addition, a copper layer was sputter deposited to 200 nm thickness at 3 to 5 mTorr using a roll-to-roll vacuum web coating system. The deposition source was DC magnetron sputtering. Argon was the process gas. No photoresist was used; the experiment was performed on just the substrate. The copper was then flash-etched at a temperature of 23° C. for one example and a temperature of 45° C. for the other example, with a solution of 15 g/l hydrogen peroxide and 180 g/l sulfuric acid (made with Perma-Etch, available from Electrochemicals Inc., of Maple Plain, Minn.) until copper was visibly removed and part or all of the tie layer remained. Subsequently, the substrates were treated with a solution of 20 g/l potassium permanganate and 60 g/l potassium hydroxide at 50° C. for 32 seconds. The amount of NiCr remaining was determined by elemental ESCA surface analysis. This analysis detected no Ni or Cr on the polyimide surfaces. In this example (unlike Example 1), the 72.5% Tr NiCr could be etched because some Ni—Cr was removed during the peroxide treatment for the copper removal. The peroxide treatment is a slow process and it left a significant amount of Ni—Cr on the substrate. However, the peroxide treatment etched enough of the Ni—Cr so that the subsequent permanganate treatment completed the removal of the Ni—Cr. Thus the process window for a given tie layer removal will also depend on what effect the copper removal step has on the tie layer thickness, composition, and structure.

Example 3

A 77.5% Tr Ni—Cr polyimide substrate was prepared in a manner similar to that described in Example 1, with the oxygen DC glow voltage at 4.5 kV. A copper layer was sputter deposited to 200 nm thickness at 3 to 5 mTorr. When the copper was removed, according to the method described in example 2, the surface resistance of the polyimide was 5 e+11 ohms/square. It was not determined if any Ni—Cr was removed by the copper removal step. The film was then dipped in a solution containing 20 g/l sodium permanganate and 80 g/l sodium hydroxide for 30 seconds. The temperature of the etching solution was at 30C. Afterward, no Ni or Cr was seen on the polyimide surface and the surface resistance was 4 e+10 ohms/square. Etching of the polyimide was continued for an additional 90 seconds after the Ni—Cr was removed. Approximately 0.06 microns of polyimide were removed. It was found that the surface resistance increased by 1000 times to greater than 1 e+14 ohms/sq.

Example 4

Two 77.5% Tr Ni—Cr polyimide substrates were prepared in a manner similar to that described in Example 1, with the oxygen DC glow voltage at 4.5 kV. A copper layer was sputter deposited to 200 nm thickness at 3 to 5 mTorr. When the copper was removed, according to the method described in example 2, the surface resistance of the polyimide was 9.3 e+11 ohms/square. It was not determined if any Ni—Cr was removed by the copper removal step. The first substrate was then dipped in a solution containing 180 g/l sodium permanganate and 80 g/l sodium hydroxide for 15 seconds. The temperature of the etching solution was at 30° C. The surface resistance of the first substrate was 2.75 e+10. The second substrate was etched at the same conditions but for 30 seconds. For the second substrate, the surface resistance increased to greater than 1 e+14 ohms/square.

Example 5

The experiment of Example 4 was repeated but the temperature of the etchant was at 50° C. rather than 30° C. The initial surface resistance for the sample was 1.02 e+12. After just 15 seconds of etching, the surface resistance was increased to more than 1 e+14 ohm/square.

Example 6

Five substrates were prepared, in a manner similar to that described in Example 1, with polyimide films having NiCr tie layer optical transmissions of 42.5%, 52.5%, 62.5%, 72.5% and 82.5%, respectively. A Cu layer was sputter deposited to 200 nm thickness at 3 to 5 mTorr. The sputtered copper was then flash-etched at a temperature of 23° C. with a solution of 15 g/l hydrogen peroxide and 180 g/l sulfuric acid (made with Perma-Etch, available from Electrochemicals Inc., Maple Plain, Minn.).

The substrates were then sprayed with a solution containing 20 g/l potassium permanganate and 20 g/l potassium hydroxide and deionized water at a temperature of 30° C. Samples of all the substrates were etched for 133 sec. Samples of the 72.5% Tr Ni—Cr substrate and the 82.5% Tr Ni—Cr substrate were also etched at dwell times of 37 sec., 69 sec., and 85 sec. Samples of the other substrates were not etched for these shorter times because, under the given etching conditions, satisfactorily results were not achieved at the higher dwell times. For each of the samples, the surface resistance was measured with a mega-ohm meter.

For the 72.5% Tr Ni—Cr and 82.5% Tr Ni—Cr substrate samples etched at 85 sec. dwell time, the peel strength, heated peel strength, acid undercut and surface resistance were studied.

Peel strength was measured according to the following process: A 25 micrometer layer of copper was plated on the Ni—Cr coated polymer substrate. A 3 mm wide strip of adhesive was laminated on the copper layer. The exposed portion of the copper layer was etched away leaving only the 3 mm wide strip of the copper layer protected by the adhesive tape. The adhesive tape was removed. The 3 mm wide copper strip was peeled off of the Ni—Cr coated substrate at a 90° angle as the force required to peel off the strip was measured.

Heated peel strength was measured in a similar manner except that prior to conducting the peel force measurement to remove the 3 mm wide copper strip from the Ni—Cr coated substrate, the substrate structure was subjected to the following heating profile.

| Temp (° C.) | Time (min) |
|---|---|
| 25 | Start |
| 45 | 2 |
| 128 | 2 |
| 185 | 1 |
| 226 | 1 |
| 258 | 1 |
| 284 | 1 |
| 304 | 1 |
| 315 | 1 |
| 321 | 1 |
| 320 | 1 |
| 306 | 1 |
| 285 | 1 |
| 264 | 1 |
| 234 | 1 |
| 191 | 1 |
| 149 | 1 |
| 101 | 2 |
| 54 | 8 |
| 25 | 5 |
| 25 | End |

Acid undercut refers to the echant etching the outer portions of a polymeric film that are covered by copper.

Figure 2:
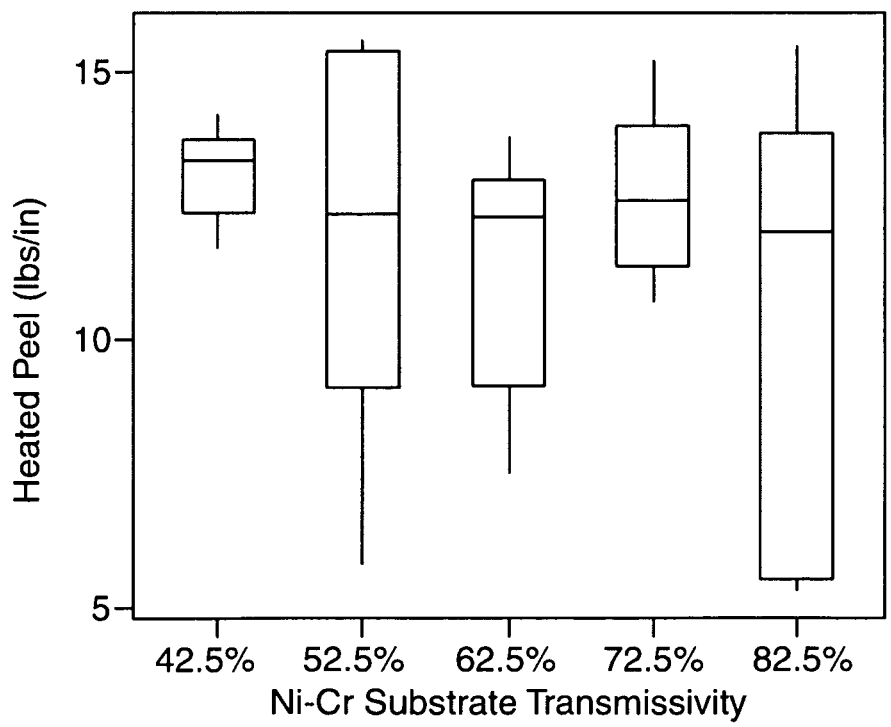
FIG. 2 shows the heated peel strength for exemplary articles of the present invention.
Figure 3:
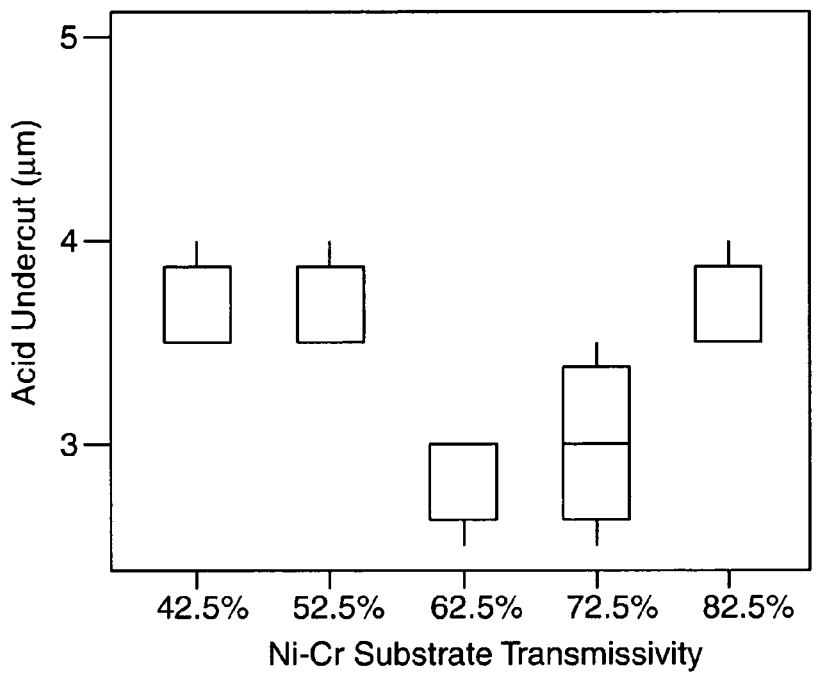
FIG. 3 shows the acid undercut for exemplary articles of the present invention.

FIGS. 1 and 2 show that peel strength and heated peel strength were not affected by the tie layer thickness. FIG. 3 shows that acid undercut was highest for the thickest Ni—Cr layers. On the other hand, surface resistance after Ni—Cr etch showed the effect of Ni—Cr thickness on the etching process. As indicated in Table 1, Ni—Cr substrates having lower than 72.5% Tr showed low surface resistance (less than 1 e+8) even after long etching times and Ni—Cr substrates having higher than 72.5% showed high surface resistance (greater than 1 e+8) even at after short dwell times.

TABLE 1

Surface resistance for Ni—Cr substrate with different optical transmission

| Tie layer | Tr - % | Dwell times | | | |
|---|---|---|---|---|---|
| | | 133 sec | 85 sec | 69 sec | 37 sec |
| NiCr | 42.5 | NG | — | — | NG |
| NiCr | 52.5 | NG | — | — | NG |
| NiCr | 62.5 | NG | — | — | NG |
| NiCr | 72.5 | OK | OK | OK | OK |
| NiCr | 82.5 | OK | OK | OK | OK |

NG = Low resistance < 1 e + 8 ohm
OK = acceptable resistance > 1 e + 8 ohm

Examination of the circuits with ESCA showed that Ni and Cr remained on the 72.5% Tr substrate etched for the 37 sec. However the 72.5% Tr Ni—Cr substrate samples etched for longer dwell times did not show any significant amount of Ni or Cr remaining.

Example 7

Figure 4:
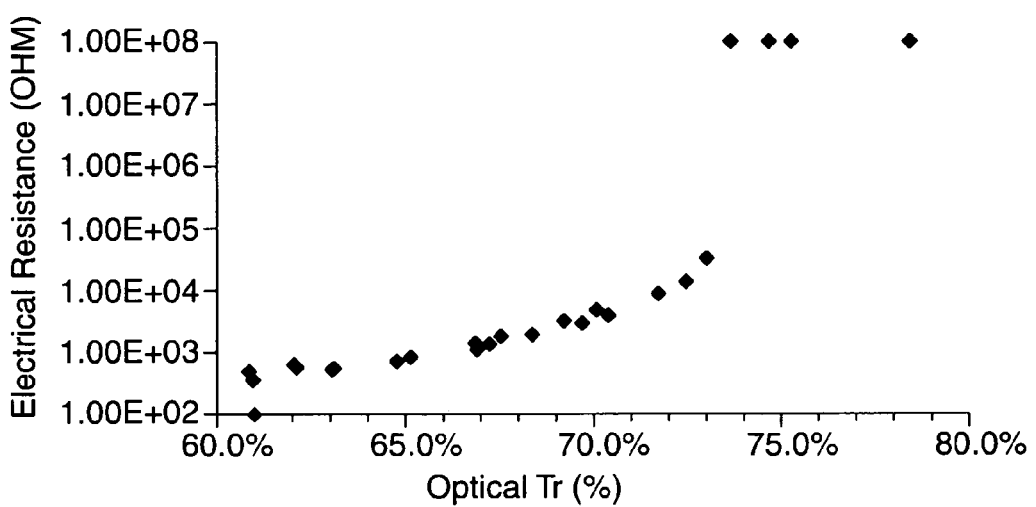
FIG. 4 shows a graph comparing optical transmissivity versus electrical resistance for exemplary articles of the present invention.

This example was prepared in a manner similar to that described in Example 1, but for this example, a mask was placed between the sputtering source and polyimide substrate web. The mask opening was shaped to produce non-uniform film thickness across the width of the web. The Ni—Cr sputtering was done so that the optical transmission varies from 60% on one edge of the web to 80% on the other edge. NiCr was sputtered with this mask and a substrate which has 60% to 80% Tr across the web was obtained. Copper was sputter deposited then flash-etched at a temperature of 23° C. with a solution of 15 g/l hydrogen peroxide and 180 g/l sulfuric acid (made with Perma-Etch, available from Electrochemicals Inc., Maple Plain, Minn.) to remove the sputtered copper. After removal of the sputtered copper, the substrate was exposed to a solution containing 20 g/l potassium permanganate and 20 g/l sodium hydroxide for 100 sec. Electrical sheet resistance and optical transmission were measured at the same, equally spaced locations across the web. When sheet resistance was compared with optical transmission, it was determined that a thickness of NiCr providing 70-73% Tr and above would provided 1 e+8 ohm resistance after polyimide etching by the permanganate chemistry, as shown in FIG. 4.

Various modifications and alterations of this invention will become apparent to those skilled in the art without departing from the scope and spirit of this invention and it should be understood that this invention is not to be unduly limited to the illustrative embodiments set forth herein.

The invention claimed is:

1. A method comprising:
providing a dielectric substrate having a first metal layer that is permeable to a dielectric etchant capable of etching the dielectric substrate; and
exposing at least a portion of the first metal layer to the dielectric etchant such that the portion of the dielectric layer under said portion of the first metal layer is etched,
wherein the dielectric etchant comprises an oxidizing agent and a base that comprises at least one of (1) about 20 to about 100 grams/liter of sodium hydroxide and (2) about 60 to about 100 grams/liter of potassium hydroxide.

2. The method of claim 1 wherein at least a portion of the first metal layer is covered by a second metal layer that is impermeable to the dielectric etchant.

3. The method of claim 1 wherein the first metal layer is selected from nickel, chrome, or alloys thereof.

4. The method of claim 1 wherein the first metal layer has an optical transmission from about 20% to about 80%.

5. The method of claim 1 wherein the dielectric substrate comprises polyimide.

6. The method of claim 1 further comprising removing a portion of the first metal layer over the etched portion of the dielectric substrate.

7. The method of claim 6 wherein etching of the dielectric substrate is allowed to continue after the first metal layer is substantially removed.

8. The method of claim 7 wherein the dielectric substrate is surface-treated and the etching is allowed to continue until at least a portion of surface-treated dielectric material is removed.

9. The method of claim 7 wherein the etching is further allowed to continue until the surface resistance of the dielectric material is increased.

10. A method comprising:
providing a dielectric substrate having a first metal layer that is permeable to a dielectric etchant capable of etching the dielectric substrate; and
exposing at least a portion of the first metal layer to the dielectric etchant such that the portion of the dielectric layer under said portion of the first metal layer is etched,
wherein the dielectric etchant comprises sodium permanganate and at least one base.

11. The method of claim 10 further comprising removing at least a portion of the first metal layer over the etched portion of the dielectric substrate.

12. The method of claim 10 wherein at least a portion of the first metal layer is covered by a second metal layer that is impermeable to the dielectric etchant.

13. The method of claim 10 wherein the first metal layer is selected from nickel, chrome, or alloys thereof.

14. The method of claim 10 wherein the first metal layer has an optical transmission from about 20% to about 80%.

15. The method of claim 10 wherein the dielectric substrate comprises polyimide.

16. The method of claim 10 wherein etching of the dielectric substrate is allowed to continue after the first metal layer is substantially removed.

17. The method of claim 16 wherein the dielectric substrate is surface-treated and the etching is allowed to continue until at least a portion of the surface-treated dielectric material is removed.

18. The method of claim 16 wherein the etching is further allowed to continue until the surface resistance of the dielectric material is increased.

19. A method comprising:
providing a dielectric substrate having at least a first metal layer;
exposing at least a portion of the first metal layer to an etchant capable of etching the first metal layer for a time sufficient to cause the first metal layer to be thinned sufficiently to be permeable to a dielectric etchant capable of etching the dielectric substrate; and exposing at least a portion of the first metal layer to the dielectric etchant such that the dielectric substrate under said portion of the first metal layer is etched.

20. The method of claim 19 further comprising removing at least a portion of the first metal layer over the etched portion of the dielectric substrate.

21. The method of claim 19 wherein the dielectric substrate further comprises a second metal layer on the first metal layer and the etchant is capable of etching both the first and second metal layers.

* * * * *